(12) United States Patent
Choi

(10) Patent No.: US 8,369,136 B2
(45) Date of Patent: Feb. 5, 2013

(54) RESISTIVE MEMORY EMPLOYING DIFFERENT PULSE WIDTH SIGNALS FOR READING DIFFERENT MEMORY CELLS

(75) Inventor: Byung-Gil Choi, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 379 days.

(21) Appl. No.: 12/662,985

(22) Filed: May 14, 2010

(65) Prior Publication Data

US 2010/0290276 A1 Nov. 18, 2010

(30) Foreign Application Priority Data

May 14, 2009 (KR) .................. 10-2009-0042202

(51) Int. Cl.
*G11C 11/00* (2006.01)
(52) U.S. Cl. ........................ 365/163; 365/148
(58) Field of Classification Search .................. 365/148, 365/163
See application file for complete search history.

(56) References Cited

U.S. PATENT DOCUMENTS

| 6,603,692 | B2 | 8/2003 | Hirota | |
|---|---|---|---|---|
| 7,391,644 | B2 * | 6/2008 | Cho et al. | 365/163 |
| 7,903,457 | B2 * | 3/2011 | Lung | 365/163 |
| 2007/0195616 | A1 | 8/2007 | Fallah | |
| 2008/0266942 | A1 * | 10/2008 | Jeong et al. | 365/163 |

FOREIGN PATENT DOCUMENTS

| JP | 2006-303150 | 11/2006 |
|---|---|---|
| KR | 10-2008-0022184 | 3/2008 |

* cited by examiner

*Primary Examiner* — Alexander Sofocleous
*Assistant Examiner* — Lance Reidlinger
(74) *Attorney, Agent, or Firm* — Harness, Dickey & Pierce, P.L.C.

(57) ABSTRACT

A semiconductor memory includes a memory cell array including a plurality of memory cells arranged in rows and columns, a plurality of bit lines, each bit line connected to a corresponding column of the memory cells; a column selection circuit configured to select at least one bit line in response to a column select signal; and a read circuit configured to precharge the selected bit line in response to a precharge signal, to apply a read bias to the precharged bit line in response to a read bias provision signal, and to read data from the memory cells. A resistance level of each of the memory cells varies according to data stored therein, and the read circuit reads data from a first memory cell of the plurality of memory cells in response to the precharge signal having a first pulse width and reads data from a second memory cell of the plurality of memory cells in response to the precharge signal having a second pulse width.

13 Claims, 9 Drawing Sheets

RESISTIVE MEMORY EMPLOYING DIFFERENT PULSE WIDTH SIGNALS FOR READING DIFFERENT MEMORY CELLS

This application claims priority under 35 U.S.C. §119 to Korean Patent Application No. 10-2009-0042202 filed on May 14, 2009 in the Korean Intellectual Property Office, the disclosure of which is incorporated herein by reference in its entirety.

BACKGROUND

1. Field

Example embodiments relate to a semiconductor memory using a resistance material, and particularly, to a semiconductor memory using a resistance material, the semiconductor memory having improved reliability during a read operation.

2. Description

Examples of semiconductor memories using resistance materials include phase-change random access memories (PRAMs), resistive RAMs (RRAMs), and magnetic RAMs (MRAMs). While dynamic RAMs (DRAMs) or flash memories store data using charges, semiconductor memories using resistance materials store data by changing the state of a phase change material such as a chalcogenide alloy (in the case of PRAMs), changing the resistance of a variable resistance material (in the case of RRAMs), or changing the resistance of a magnetic tunnel junction (MTJ) thin film according to a magnetization state of a ferromagnetic material (in the case of MRAMs).

For example, a phase-change material of a PRAM changes into a crystalline state or an amorphous state as it is cooled after being heated. The phase-change material has low resistance in the crystalline state and has high resistance in the amorphous state. As a result, the crystalline state may be defined, for example, as set data or data 0, and the amorphous state may be defined, for example, as reset data or data 1.

SUMMARY

According to example embodiments, a semiconductor memory includes a memory cell array including a plurality of memory cells arranged in a plurality of rows and a plurality of columns; a plurality of bit lines, each bit line connected to a corresponding column of the memory cells; a column selection circuit configured to select at least one bit line of the plurality of bit lines in response to a column select signal; and a read circuit configured to precharge the selected at least one bit line in response to a precharge signal, apply a read bias to the precharged at least one bit line in response to a read bias provision signal, and read data from the memory cells connected to the precharged at least one bit line.

According to example embodiments, a resistance level of each memory cell of the plurality of memory cells varies according to data stored in the memory cell, and the read circuit is configured to read data from a first memory cell of the plurality of memory cells in response to the precharge signal having a first pulse width and read data from a second memory cell of the plurality of memory cells in response to the precharge signal having a second pulse width.

According to example embodiments, a resistance of a bit line between the first memory cell and the read circuit is lower than a resistance of a bit line between the second memory cell and the read circuit, and the first pulse width of the precharge signal is smaller than the second pulse width of the precharge signal.

According to example embodiments, the semiconductor memory further includes a plurality of word lines, each word line connected to a corresponding row of the plurality of memory cells; and a row selection circuit configured to select at least one word line of the plurality of word lines in response to a row select signal.

According to example embodiments, a resistance of a word line between the first memory cell and the row selection circuit is lower than a resistance of a word line between the second memory cell and the row selection circuit, and the first pulse width of the precharge signal is larger than the second pulse width of the precharge signal.

According to example embodiments, each word line of the plurality of word lines includes a first sub-word line and a second sub-word line which are connected to each other by a strapping node, and the first memory cell is located closer to the strapping node than the second memory cell.

According to example embodiments, the semiconductor memory, further includes a plurality of word lines, each word lines connected to a corresponding row of the plurality of memory cells; and a row selection circuit configured to select at least one word line of the plurality of word lines in response to a row select signal.

According to example embodiments, the row select signal has different pulse widths when the word line coupled to the first memory cell is selected and when the word line coupled to the second memory cell is selected.

According to example embodiments, the read bias provision signal has different pulse widths when data is read from the first memory cell and when data is read from the second memory cell.

According to example embodiments, the semiconductor memory, further includes a read pulse generator configured to provide the precharge signal and the read bias provision signal and determine a pulse width of the precharge signal and a pulse width of the read bias provision signal in response to an address signal.

According to example embodiments, the read circuit includes a sensing node connected to the plurality of bit lines, a precharge unit connected to the sensing node and configured to precharge the plurality of bit lines in response to the precharge signal, a read bias generation unit connected to the sensing node and configured to provide the read bias in response to the read bias provision signal, and a sensing unit connected to the sensing node and configured to compare a voltage level of the sensing node with a voltage level of a reference bias, and output a comparison result.

According to example embodiments, the memory cell array includes diode-controlled phase-change random access memory (PRAM) cells.

According to example embodiments, a semiconductor memory includes a memory cell array including a plurality of memory cells arranged in a plurality of rows and a plurality of columns; a plurality of bit lines, each bit line connected to a corresponding column of the memory cells; a column selection circuit configured to select at least one bit line of the plurality of bit lines in response to a column select signal; and a read circuit configured to precharge the selected at least one bit line in response to a precharge signal, apply a read bias to the precharged at least one bit line in response to a read bias provision signal, and read data from the memory cells connected to the precharged at least one bit line, According to example embodiments, a resistance level of each memory cell of the plurality of memory cells varies according to data stored in the memory cell, and the read circuit is configured to read data from a first memory cell of the plurality of memory cells in response to the read bias provision signal having a first pulse width and to read data from a second memory cell of the plurality of memory cells in response to the read bias provision signal having a second pulse width.

According to example embodiments, a semiconductor memory includes a memory cell array including a plurality of memory cells arranged in a plurality of rows and a plurality of columns; a plurality of word lines, each word line connected to a corresponding row of the memory cells; and a row selection circuit configured to select at least one word line in response to a row select signal and to pull down voltage level of the selected at least one word line.

According to example embodiments, a resistance level of each memory cell of the plurality of memory cells varies according to data stored in the memory cell, and the row selection circuit is configured to select a word line connected to a first memory cell of the plurality of memory cells in response to the row select signal having a first pulse width and to select a word line connected to a second memory cell of the plurality of memory cells in response to the row select signal having a second pulse width.

According to example embodiments, a resistance of the word line between the first memory cell and the row selection circuit is lower than resistance of the word line between the second memory cell and the row selection circuit.

According to example embodiments, the row select signal has different pulse widths when the word lines connected to the first memory cell is selected and when the word line connected to the second memory cell is selected.

According to example embodiments, the pulse width of the row select signal is based on a resistance of the word line between the first memory cell and the row selection circuit and the second memory cell and the row selection circuit.

According to example embodiments, the read circuit is configured to read data from the first memory cell of the plurality of memory cells in response to the read bias provision signal having a first pulse width and to read data from the second memory cell of the plurality of memory cells in response to the read bias provision signal having a second pulse width.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
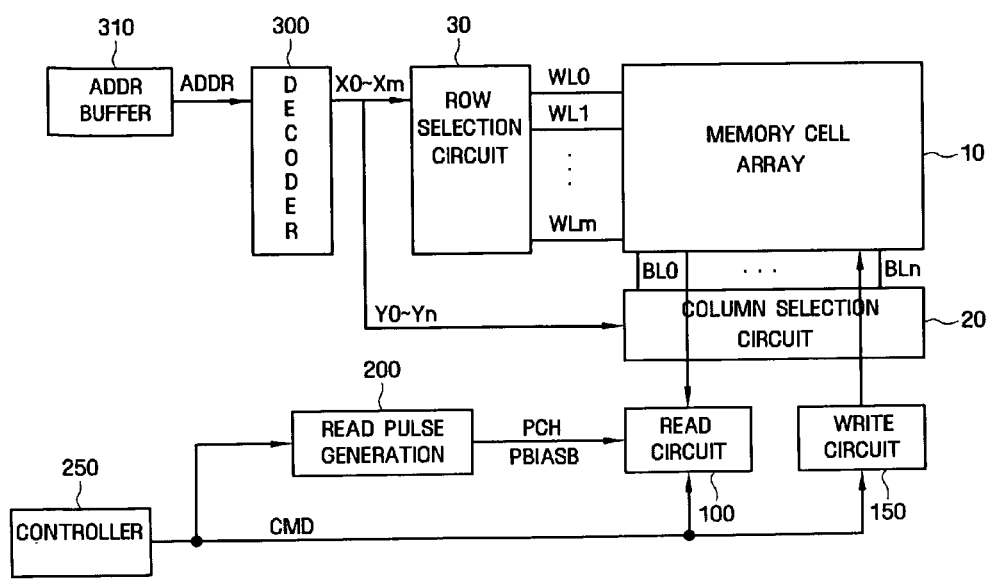
FIG. 1 is a block diagram of a semiconductor memory according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts.

Hereinafter, example embodiments are described using a phase-change random access memory (PRAM). However, it will be obvious to those of ordinary skill in the art that example embodiments are not limited thereto, and can also be applied to all semiconductor memories using resistance materials, such as resistive RAMs, ferroelectric RAMs, and magnetic RAMs.

Figure 2:
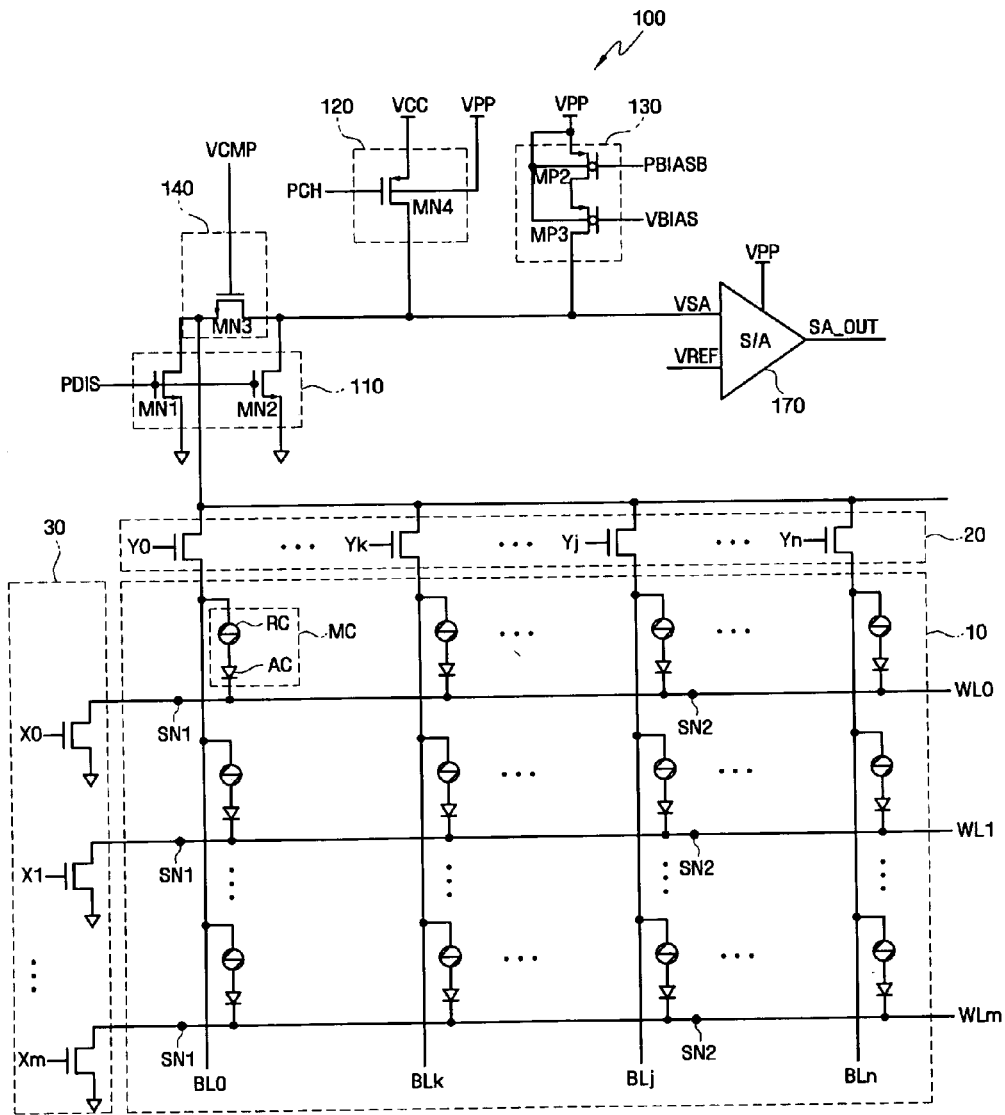
FIG. 2 is a diagram illustrating a memory cell array illustrated in FIG. 1 and its peripheral circuits.

FIG. 1 is a block diagram of a semiconductor memory according to example embodiments. FIG. 2 is a diagram illustrating a memory cell array 10 illustrated in FIG. 1 and its peripheral circuits.

Referring to FIGS. 1 and 2, the semiconductor memory includes the memory cell array 10, an address buffer 310, a decoder 300, a row selection circuit 30, a column selection circuit 20, a read pulse generator 200, a read circuit 100, and a write circuit 150.

The memory cell array 10 includes rows and columns of memory cells MC. The rows of the memory cells MC are connected to a plurality of word lines WL0 through WLm, and the columns of the memory cells MC are connected to a plurality of bit lines BL0 through BLn.

Each of the memory cells MC may include a variable resistor RC and an access device AC. The variable resistor RC includes a phase-change material having different resistance values in a crystalline state and an amorphous state. The access device AC controls electric current flowing through the variable resistor RC. The access device AC may be a diode or a transistor coupled in series with the variable resistor RC. The access device AC illustrated in FIG. 2 is a diode. However, example embodiments are not limited thereto. A phase-change memory cell that uses a diode as the access device AC is referred to as a diode-controlled PRAM cell.

Various types of materials may be used as the phase-change material. For example, the phase-change material may a combination of two elements such as GaSb, InSb, InSe. $Sb_2Te_3$ or GeTe, a combination of three elements such as GeSbTe, GaSeTe, InSbTe, $SnSb_2Te_4$ or InSbGe, or a combination of four elements such as AgInSbTe, (GeSn)SbTe, GeSb(SeTe) or $Te_{81}Ge_{15}Sb_2S_2$. In particular, GeSbTe, which is a combination of germanium (Ge), antimony (Sb) and tellurium (Te), may be used as the phase-change material.

The variable resistor RC in each memory cells MC may be set to a set resistance state or a reset resistance state. Accordingly, each memory cells MC may store one bit of data. However, example embodiments are not limited thereto. The variable resistor RC may also be set to multiple levels. That is, each memory cells MC may be a multi-level memory cell that stores more than one bit of data.

Although not shown in the drawings, as semiconductor memories increase in capacity and integration density, the word lines WL0 through WLm therein may, for example, be implemented in a hierarchical word line structure using main and sub-word lines. In addition, the bit lines BL0 through BLn included in the semiconductor memories may also, for example, be implemented in a hierarchical bit line structure using global and local bit lines.

The decoder 300 respectively provides row select signals X0 through Xm and column select signals Y0 through Yn to the row selection circuit 30 and the column selection circuit 20 using an address signal ADDR received from the address buffer 310. The row selection circuit 30 selects one (e.g., the word line WL0) of the word lines WL0 through WLm in response to each of the row select signals X0 through Xm. The column selection circuit 30 selects one (e.g., the bit line BL0) of the bit lines BL0 through BLn in response to each of the column select signals Y0 through Yn.

Each of the row select signals X0 through Xm provided by the decoder 300 in the semiconductor memory according to example embodiments may have a different pulse width based on a position (or address) of a selected memory cell MC. Accordingly, the position of each selected memory cell MC may determine a time duration for which a corresponding word line WL0 through WLm is selected during a read operation. This feature may prevent resistances of the word lines WL0 through WLm (hereinafter, referred to as "word line resistances") from degrading the reliability of the semiconductor memory during the read operation, which will be described later with reference to FIGS. 3 and 4.

The read circuit 100 reads data stored in a memory cell MC which is selected from the memory cell array 10. Specifically, the read circuit 100 precharges a bit line selected from the bit lines BL0 through BLn to a desired level in response to a precharge signal PCH, applies a read bias to the precharged bit line in response to a read bias provision signal PBIASB, and reads a resistance level stored in a memory cell MC. The precharge signal PCH and the read bias provision signal PBIASB may be provided by the read pulse generator 200. Referring to FIG. 2, the read circuit 100 may include a discharge unit 110, a precharge unit 120, a read bias generation unit 130, a clamping unit 140, and a sensing unit 170.

Before the read operation begins, the discharge unit 110 discharges a bit line and/or a sensing node VSA, which is coupled to a selected memory cell MC, to a desired level, e.g., to the level of a ground voltage VSS. The discharge unit 110 may include n-channel metal oxide semiconductor (NMOS) transistors MN1 and MN2. The NMOS transistor MN1 is coupled between the bit lines BL0 through BLn and the ground voltage VSS and receives a discharge signal PDIS at a gate thereof. The NMOS transistor MN2 is coupled between the sensing node VSA and the ground voltage VSS and receives the discharge signal PDIS at a gate thereof.

In response to the precharge signal PCH, the precharge unit 120 precharges the sensing node VSA to a desired level during a precharge period of the read operation. The precharge unit 120 may be an NMOS transistor MN4 which is coupled between a power supply voltage VCC and the sensing node VSA and receives the precharge signal PCH at a gate thereof.

To read a resistance level of a selected memory cell MC, the read bias generation unit 130 applies the read bias to a corresponding bit line (specifically, the sensing node VSA) in response to the read bias provision signal PBIASB. The read bias generation unit 130 may include p-channel MOS (PMOS) transistors MP2 and MP3. The PMOS transistor MP2 is coupled to a step-up voltage VPP and receives the read bias provision signal PBIASB at a gate thereof. In addition, the PMOS transistor MP3 is coupled to the sensing node VSA and receive a control bias VBIAS at a gate thereof. Regions of a substrate in which the PMOS transistors MP2 and MP3 are formed may be coupled to the step-up voltage VPP.

The clamping unit 140 clamps a bit line selected from the bit lines BL0 through BLn to a desired bias level, e.g., within a range appropriate for the read operation. Specifically, the clamping unit 140 clamps a bit line selected from the bit lines BL0 through BLn to a desired level equal to or lower than the level of a threshold voltage Vth of a phase-change material. This is because a bit line clamped to a level higher than the threshold voltage Vth can change the phase of the phase-change material of a selected memory cell MC. The clamping unit 140 may be an NMOS transistor MN3 which is coupled between the bit lines BL0 through BLn and the sensing node VSA and receives a clamping control signal VCMP at a gate thereof. The clamping control signal VCMP may be, but is not limited to, a constant voltage signal.

The sensing unit 170 compares the level of the sensing node VSA with the level of a reference bias VREF and outputs a comparison result SA_OUT. When the level of the sensing node VSA is higher than that of the reference bias VREF, the sensing unit 170 may output the comparison result SA_OUT at a high level. When the level of the sensing node VSA is lower than the reference bias VREF, the sensing unit 170 may output the comparison result SA_OUT at a low level. The sensing unit 170 may be a current sense amplifier that senses the change in electric current, which flows through a bit line coupled to a selected memory cell MC, with respect to a reference current. Alternatively, the sensing unit 170 may be a voltage sense amplifier that senses a voltage change with respect to a reference voltage. The sensing unit 170 illustrated in FIG. 2 is a voltage sense amplifier.

The write circuit 150 writes data to a memory cell MC selected from the memory cell array 10. The write circuit 150 may include a data input buffer which receives and buffers external data and a write driver which writes the data to a memory cell MC selected from the memory cell array 10.

The read operation of the semiconductor memory according to example embodiments is described with reference to FIGS. 1 through 4.

Figure 3:
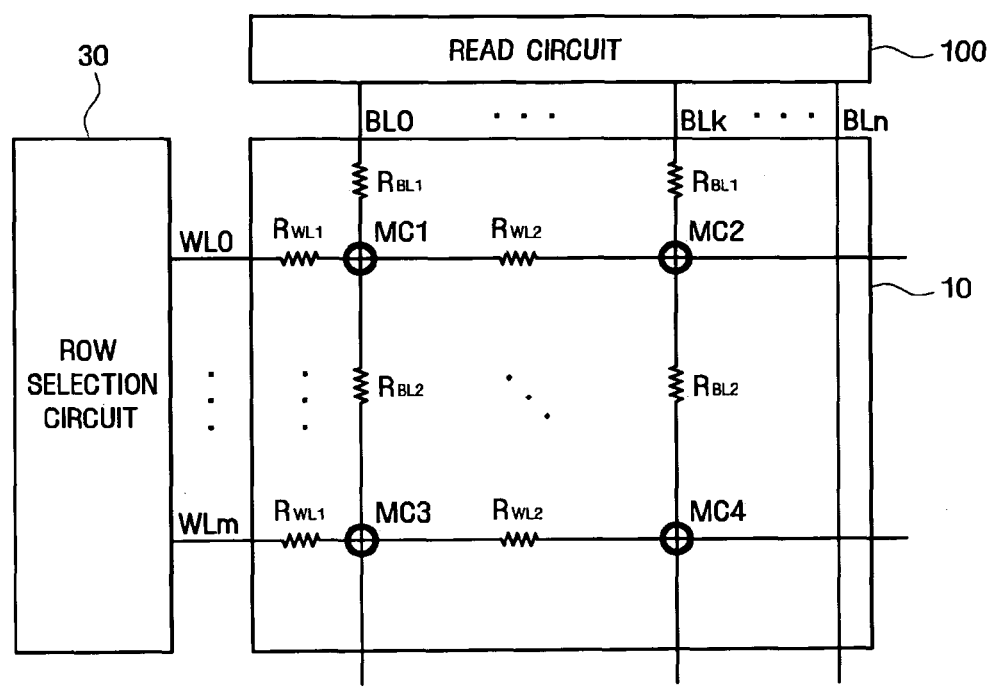
FIG. 3 is a diagram for explaining the semiconductor memory illustrated in FIG. 1.
Figure 4:
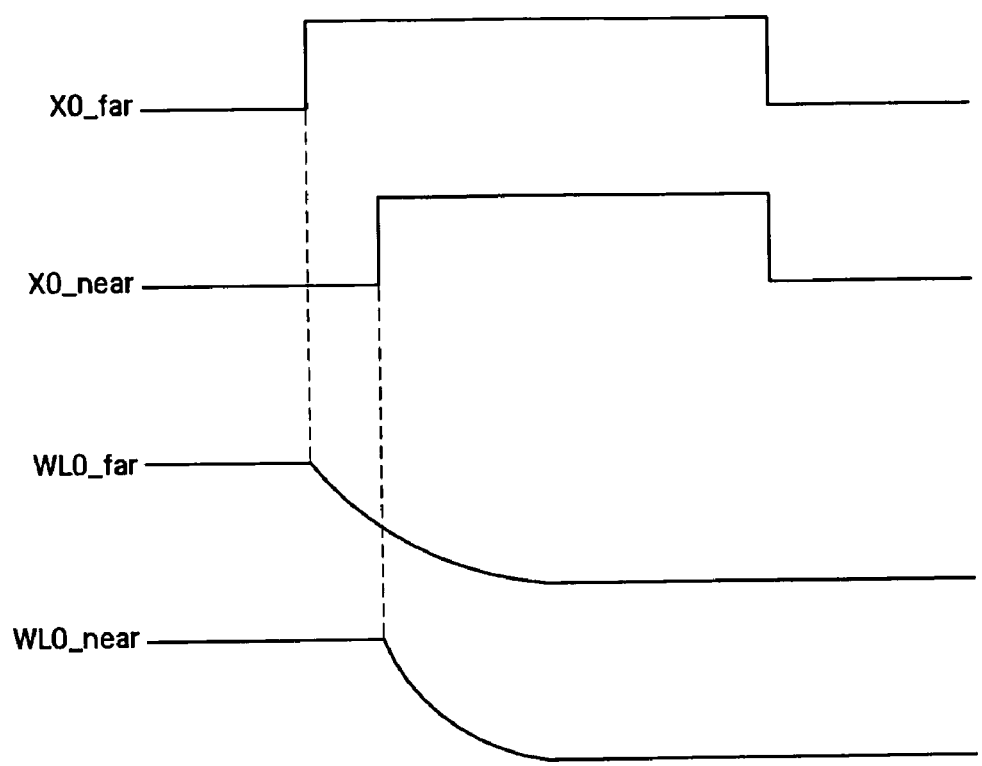
FIG. 4 is a timing diagram illustrating the operation of the semiconductor memory illustrated in FIG. 1.

FIG. 3 illustrates the semiconductor memory illustrated in FIG. 1, according to example embodiments. In the semiconductor memory of FIG. 3, resistances of the word lines WL0 through WLm and of the bit lines BL0 through BLn are respectively illustrated, for example, as $R_{WL1}$, $R_{WL2}$, ... and $R_{BL1}$, $R_{BL2}$, ... on the word lines WL0 through WLm and the bit lines BL0 through BLn. FIG. 4 is a timing diagram illustrating the operation of the semiconductor memory illustrated in FIG. 1.

Referring to FIG. 3, the word line resistance between each of memory cells MC1 through MC4 and the row selection circuit 30 may depend on the position of each of the memory cells MC1 through MC4 in the memory cell array 10. Specifically, a word line resistance $R_{WL1}+R_{WL2}$ between the row selection circuit 30 and a memory cell (e.g., MC2 or MC4) located far from the row selection circuit 30 may be greater than a word line resistance $R_{WL1}$ between the row selection circuit 30 and a memory cell (e.g., MC1 or MC3) located close to the row selection circuit 30.

Accordingly, the position of each of the memory cells MC1 through MC4 may determine the speed at which a word line between each of the memory cells MC1 through MC4 and the row selection circuit 30 is selected, and discharged from a word line disable voltage to a word line enable voltage (e.g., a ground voltage). Specifically, if the row selection circuit 30 selects a word line (e.g., WL0 or WLm), a portion of the word line (e.g., WL0 or WLm) between the row selection circuit 30 and a memory cell (e.g., MC2 or MC4) located farther from the row selection circuit 30 may be discharged slower than a portion of the word line (e.g., WL0 or WLm) between the row selection circuit 30 and a memory cell (e.g., MC1 or MC3) located closer to the row selection circuit 30. Therefore, if resistance levels stored in the selected memory cells MC1 through MC4 are sensed, for example, read by pre-charging the selected bit lines BL0 and BLk, selecting the word lines WL0 and WLm, and applying the read bias to the selected memory cells MC1 through MC4, the read resistance levels of the memory cells MC2 and MC4 located farther from the row selection circuit 30 may be higher than the read resistance levels of the memory cells MC1 and MC3 located closer to the row selection circuit 30. That is, even if the same resistance level is stored in each of the memory cells MC1 through MC4, the resistance level that is read may vary according to the position of each of the memory cells MC1 through MC4.

However, in the semiconductor memory according to example embodiments, the pulse width of a row select signal (e.g., X0_far or X0_near) varies according to the position of each selected memory cell (e.g., MC1 or MC2), as illustrated in FIG. 4. Thus, voltage levels of portions (e.g., WL0_near and WL0_far) of a word line between the selected memory cells MC1 and MC2 and the row selection circuit 30 may be substantially equal to each other at the time of sensing the resistance levels stored in the selected memory cells MC1 and MC2.

Specifically, when the memory cell MC2 having a relatively high word line resistance between itself and the row selection circuit 30 is to be selected, the row select signal X0_far having a relatively large pulse width may be provided. On the other hand, when the memory cell MC1 having a relatively low word line resistance between itself and the row selection circuit 30 is to be selected, the row select signal X0_near having a relatively small pulse width may be provided. That is, the word line WL0 may be selected earlier when the resistance stored in the memory cell MC2 having a relatively high resistance between itself and the row selection circuit 30 is to be read than when the resistance stored in the memory cell MC1 having a relatively low word line resistance between itself and the row selection circuit 30 is to be read.

In the semiconductor memory according to example embodiments, if the same resistance levels are stored in the memory cells MC, resistance levels read from the memory cells MC are substantially equal to each other, regardless of word line resistances. Therefore, reliability of the semiconductor memory during the read operation may be improved.

According to the above description, as the distance between a selected memory cell MC and the row selection circuit 30 increases, the word line resistance between them also increases. However, example embodiments are not limited thereto. For example, referring to FIG. 5, each of the word lines WL0 through WLm (e.g., WL0 or WL1) may include a first sub-word line WL10 or WL11 and a second sub-word line WL20 or WL21 (i.e., a strapping line) which has a lower resistance than that of the first sub-word line WL10 or WL11. In this case, the distance between a memory cell MC coupled to the first sub-word line WL10 or WL11 and a strapping node SN1 or SN2 may determine the word line resistance between them.

Figure 5:
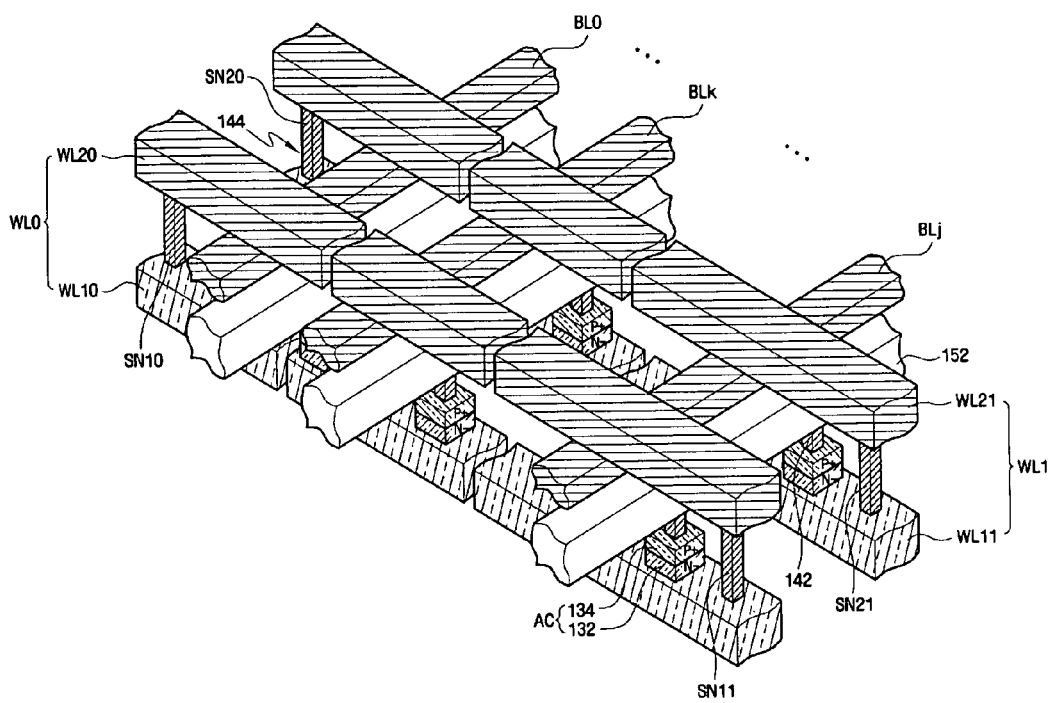
FIG. 5 is a perspective view of the semiconductor memory of FIG. 1 which includes strapping nodes.

FIG. 5 is a perspective view of the semiconductor memory of FIG. 1 which includes the strapping nodes SN1 and SN2.

Referring to FIGS. 1 and 5, each word line of the semiconductor memory may include a strapping line. In this case, the semiconductor memory may include the first sub-word lines WL10 and WL11, first and second semiconductor patterns 132 and 134, variable resistance patterns 152, bit lines BL0 through BLj, and the second sub-word lines WL20 and WL21 which are sequentially stacked. The first sub-word lines WL10 and WL11 may be connected respectively to the second sub-word lines WL20 and WL21 by strapping line contact plugs SN10, SN20, SN11, and SN21. The first sub-word lines WL10 and WL11 and the second sub-word lines WL20 and WL21 may form the word lines WL0 and WL1 illustrated in FIG. 1.

The first sub-word lines WL10 and WL11 are made of a conductive material such as polysilicon or metal and extend in a first direction. The first sub-word lines WL10 and WL11 made of polysilicon may be of an N+ type, for example, may be N+ epitaxial layers. If a semiconductor substrate is a monocrystalline semiconductor substrate, the first sub-word lines WL10 and WL11 may also be monocrystalline.

The first semiconductor patterns 132 having, e.g., an N− type are formed on each of the first sub-word lines WL10 and WL11, and the second semiconductor patterns 134 having, e.g., a P+ type are respectively formed on the first semiconductor patterns 132. The first and second semiconductor patterns 132 and 134 may be arranged on each of the first sub-word lines WL10 and WL11 along the first direction (along a direction in which the word lines WL0 and WL1 extend). In addition, each pair of the first and second semiconductor patterns 132 and 134 is separated from another pair and may form the access device AC (that is, a cell diode) of a memory cell MC.

The variable resistance patterns 152 extend on the first and second semiconductor patterns 132 and 134 in a second direction that intersects the first direction of the first sub-word lines WL10 and WL11, for example. The variable resistance patterns 152 are connected to the first and second semiconductor patterns 132 and 134 by lower electrode contacts 142. The variable resistance patterns 152 may be formed using the phase-change material described above. The variable resistance patterns 152 illustrated in FIG. 5 are line-type variable resistance patterns disposed to correspond respectively to a plurality of phase-change memory cells. However, example embodiments are not limited thereto. The variable resistance patterns 152 may also be dot-type variable resistance patterns disposed to correspond respectively to units of variable resistance cells.

The bit lines BL0 through BLj are disposed on the variable resistance patterns 152 in parallel and intersect the first and second sub-word lines WL10, WL11, WL20, and WL21. The bit lines BL0 through BLj are connected to the variable resistance patterns 152 by bit line contact plugs (not shown), respectively. The bit lines BL0 through BLj may be made of metal such as aluminum (Al) or tungsten (W).

The second sub-word lines WL20 and WL21 are disposed on the bit lines BL0 through BLj in parallel to the first sub-word lines WL10 and WL11 and are connected to the first sub-word lines WL10 and WL11 by the strapping line contact plugs SN10, SN20, SN11, and SN21. Nodes at which the first sub-word lines WL10 and WL11 are connected to the second sub-word lines WL20 and WL21 by the strapping line contact plugs SN10, SN20, SN11, and SN21 may be the strapping nodes SN1 and SN2 illustrated in FIG. 2.

The second sub-word lines WL20 and WL21 are strapping lines and are made of a material having a lower resistance than that of the material that forms the first sub-word lines WL10 and WL11. For example, the second sub-word lines WL20 and WL21 may be made of metal such as aluminum or tungsten. The second sub-word lines WL20 and WL21 are connected to the variable resistance patterns 152 by the first sub-word lines WL10 and WL11. In FIG. 5, the second sub-word lines WL20 and WL21 are disposed on the bit lines BL0 through BLj. However, example embodiments are not limited thereto. The second sub-word lines WL20 and WL21 can also be disposed under the bit lines BL0 through BLn as long as they are metal layers disposed on the first sub-word lines WL10 and WL11.

If each of the word lines WL0 through WLm (e.g., the word line WL0 or WL1) include the first sub-word line (e.g., WL10 or WL11) and the second sub-word line (e.g., WL20 or WL21), each of memory cells MC coupled to the word line WL0 or WL1 may have a different resistance between itself and the ground (or the row selection circuit 30) according to the column address thereof. That is, the distance between each of the memory cells MC coupled to the first sub-word line WL10 or WL11 and the strapping node SN1 or SN2 may determine the word line resistance between them.

Hereinafter, a semiconductor memory according to example embodiments is described with reference to FIGS. 3, 6, and 7.

Figure 6:
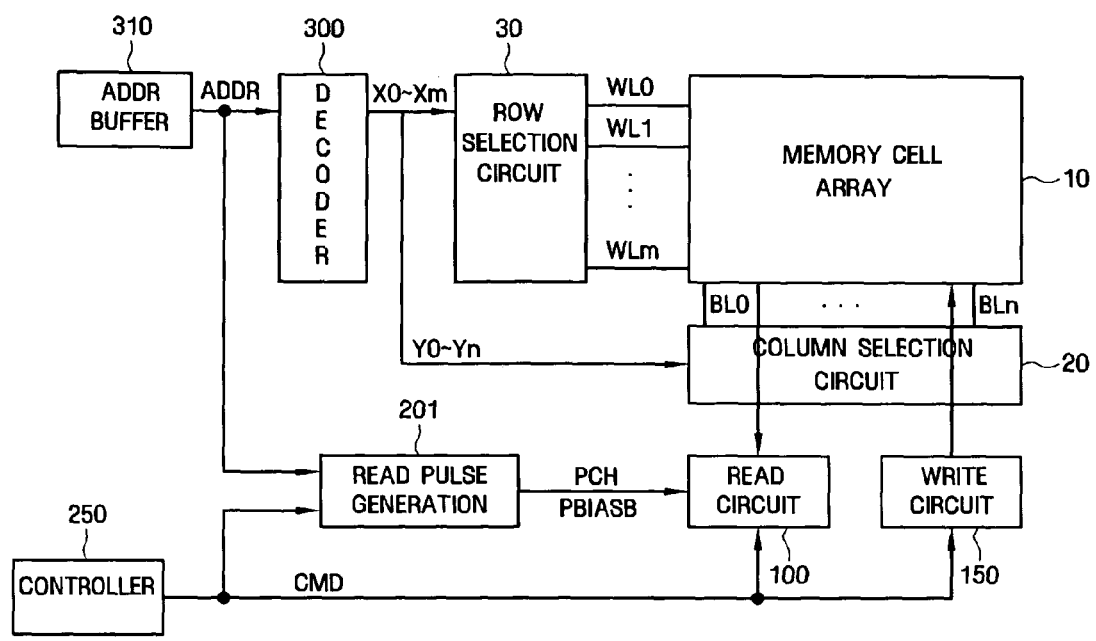
FIG. 6 is a block diagram of a semiconductor memory according to example embodiments.

FIG. 6 is a block diagram of a semiconductor memory according to example embodiments. FIG. 7 is a timing diagram illustrating the operation of the semiconductor memory illustrated in FIG. 6.

Referring to FIGS. 3 and 6, the semiconductor memory according to example embodiments is somewhat similar to the semiconductor memory according to example embodiments disclosed above, except that the pulse width of a precharge signal PCH varies according to the position of a selected memory cell MC during a read operation.

A read pulse generator 201 provides the precharge signal PCH in response to a command signal CMD received from a controller 250 and an address signal ADDR received from an address buffer 310. For example, when data is read from a first memory cell MC, the read pulse generator 201 may provide the precharge signal PCH having a first pulse width. When data is read from a second memory cell MC, the read pulse generator 201 may provide the precharge signal PCH having a second pulse width which is different from the first pulse width. That is, the read pulse generator 201 provides a read circuit 100 with the precharge signal PCH whose pulse width is determined by the address signal ADDR. Thus, the time duration for which a corresponding bit line BL0 through BLn is precharged during the read operation may vary according to the position of a selected memory cell MC. This can prevent resistances of the bit lines BL0 through BLn (hereinafter, referred to as "bit line resistance"), which are determined by positions of memory cells MC, from degrading reliability of the semiconductor memory during the read operation.

A bit line resistance $R_{BL1}$ or $R_{BL2}$ between the read circuit 100 and a memory cell (e.g., MC3 or MC4) located farther from the read circuit 100 may be greater than a bit line resistance $R_{BL1}$ between the read circuit 100 and a memory cell (e.g., MC1 or MC2) located closer to the read circuit 100. Accordingly, when a selected one of the bit lines BL0 through BLn is precharged during the read operation, a portion of the bit line between the read circuit 100 and the memory cell (e.g., MC3 or MC4) located farther from the read circuit 100 may not be fully precharged, compared with a portion of the bit line between the read circuit 100 and the memory cell (e.g., MC1 or MC2) located closer to the read circuit 100. Therefore, if resistance levels stored in the selected memory cells MC1 through MC4 are sensed by pre-charging selected bit lines BL0 and BLk, selecting word lines WL0 and WLm, and applying a read bias to the precharged bit lines BL0 and BLk, the read resistance levels of the memory cells MC3 and MC4 located farther from the read circuit 100 may be lower than the read resistance levels of the memory cells MC1 and MC2 located closer to the read circuit 100. That is, even if the same resistance level is stored in each of the memory cells MC1 through MC4, the resistance level that is read may vary according to the position of each of the memory cells MC1 through MC4.

Figure 7:
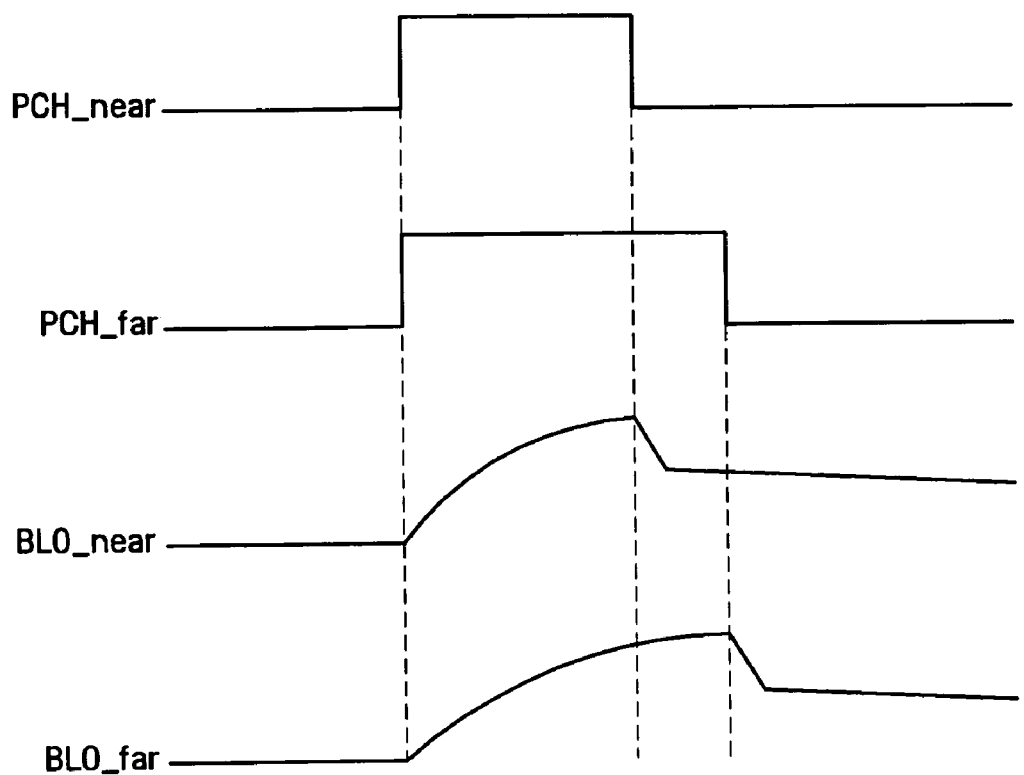
FIG. 7 is a timing diagram illustrating the operation of the semiconductor memory illustrated in FIG. 6.

However, in the semiconductor memory according to example embodiments, the pulse width of the precharge signal PCH (e.g., PCH_far or PCH_near) varies according to the position of each selected memory cell, as illustrated in FIG. 7. Thus, portions (e.g., BL0_far and BL0_near) of a bit line between selected memory cells and the read circuit 100 may be precharged to substantially the same level, regardless of positions of the selected memory cells.

Specifically, when a resistance level is to be read from a memory cell (e.g., MC3 or MC4) having a relatively high bit line resistance between itself and the read circuit 100, the precharge signal PCH_far having a relatively large pulse width may be provided. On the other hand, when a resistance level is to be read from a memory cell (e.g., MC1 or MC2) having a relatively low bit line resistance between itself and the read circuit 100, the precharge signal PCH_near having a relatively small pulse width may be provided. That is, a bit line (e.g., BL0 or BLk) may be precharged longer when the resistance stored in a memory cell (e.g., MC3 or MC4) having a relatively high bit line resistance between itself and the read circuit 100 is to be read than when the resistance stored in a memory cell (e.g., MC1 or MC2) having a relatively low bit line resistance between itself and the read circuit 100 is to be read. Therefore, reliability of the semiconductor memory during the read operation may be improved.

Like the decoder 300 included in the semiconductor memory according to previous example embodiments, example embodiments disclosed in FIG. 6 may also include a decoder 300 that may provide the address signal ADDR having a different pulse width according to the position (i.e., address) of each selected memory cell MC. However, example embodiments are not limited thereto. The decoder 300 according to example embodiments may also provide the address signal ADDR having substantially the same pulse width regardless of the position of each selected memory cell MC.

Adjusting the pulse width of the precharge signal PCH according to the bit line resistance between each selected memory cell MC and the read circuit 100 is described above. However, example embodiments are not limited thereto. In a semiconductor memory according to example embodiments, not only is the pulse width of the precharge signal PCH varied, but the pulse width of the read bias provision signal PBIASB may also be varied according to the position of each selected memory cell MC. Specifically, when data is read from a first memory cell MC, the read pulse generator 201 may provide the read bias provision signal PBIASB having a first pulse width. When data is read from a second memory cell MC, the read pulse generator 201 may provide the read bias provision signal PBIASB having a second pulse width which is different from the first pulse width. That is, the read pulse generator 201 provides the read circuit 100 with the read bias provision signal PBIASB whose pulse width is determined by the address signal ADDR. Thus, the time duration for which a read bias is applied to a precharged bit line may vary according to the position of a selected memory cell MC. This can prevent a bit line resistance from degrading reliability of the semiconductor memory during the read operation.

According to example embodiments, either the pulse width of the precharge signal PCH or the pulse width of the read bias provision signal PBIASB may be adjusted according to the bit line resistance between each memory cell MC and the read circuit 100.

According to the above description, the pulse width of a corresponding one of the row select signals X0 through Xm is adjusted according to the word line resistance between each selected memory cell MC and the row selection circuit 30, and the pulse width(s) of the precharge signal PCH and/or the pulse width of the read bias provision signal PBIASB are/is adjusted according to the bit line resistance between each selected memory cell MC and the read circuit 100. However, example embodiments are not limited thereto. According to example embodiments, the pulse widths of a corresponding one of the row selection signals X0 through Xm, the precharge signal PCH, and/or the read bias provision signal PBIASB may be adjusted variously according to the position of each selected memory cell MC.

Figure 8:
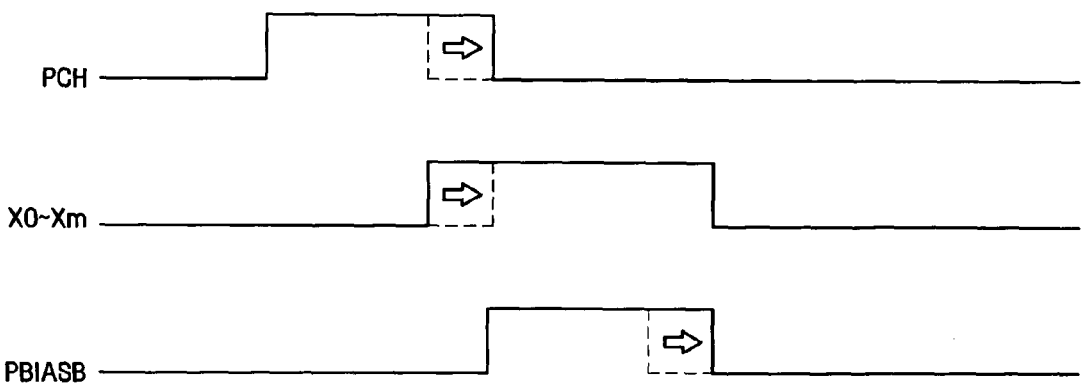
FIG. 8 illustrates the operations of semiconductor memories according to example embodiments.
Figure 8:
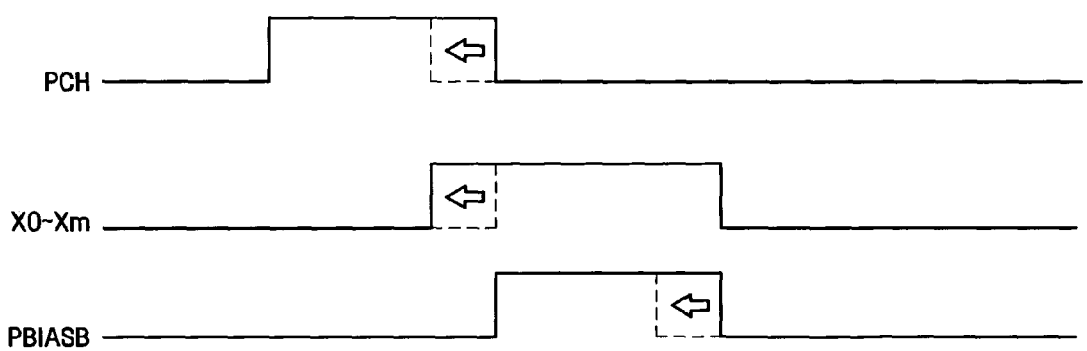

FIG. 8 illustrates an operation of semiconductor memories according to example embodiments.

Referring to FIGS. 1, 6, and 8, pulse widths of a corresponding one of the row select signals X0 through Xm, the precharge signal PCH, and/or the read bias provision signal PBIASB may be adjusted according to the word line resistance between a memory cell MC and the row selection circuit 30 and the bit line resistance between the memory cell MC and the read circuit 100.

According to example embodiments, when data is read from a memory cell MC having a relatively high word line resistance $R_{WL}$ between itself and the row selection circuit 30, the precharge signal PCH and/or the read bias provision signal PBIASB having a relatively small pulse width may be provided to a selected bit line. On the other hand, when data is to be read from a memory cell MC having a relatively low word line resistance $R_{WL}$ between itself and the row selection circuit 30, the precharge signal PCH and/or the read bias provision signal PBIASB having a relatively large pulse width may be provided to the selected bit line.

According to example embodiments, when data is read from a memory cell MC having a relatively high bit line resistance $R_{BL}$ between itself and the read circuit 100, a corresponding one of the row select signals X0 through Xm having a relatively large pulse width may be provided, thereby selecting one of the word lines WL0 through WLm. On the other hand, when data is to be read from a memory cell MC having a relatively low bit line resistance $R_{BL}$ between itself and the read circuit 100, a corresponding one of the row select signals X0 through Xm having a relatively small pulse width may be provided, thereby selecting one of the word lines WL0 through WLm.

That is, according to example embodiments, the pulse widths of a corresponding one of the row select signals X0 through Xm, the precharge signal PCH, and/or the read bias provision signal PBIASB may be adjusted according to the word line resistance between a memory cell MC and the row selection circuit 30 and the bit line resistance between the memory cell MC and the read circuit 100.

Figure 9:
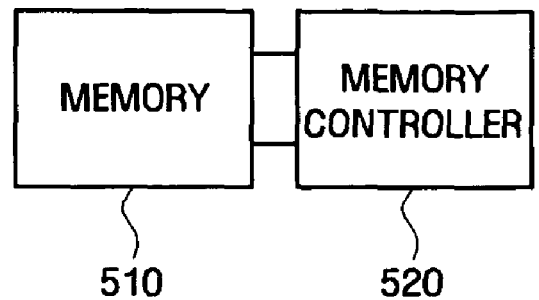
FIGS. 9 through 11 are block diagrams of systems using semiconductor memories according to example embodiments.
Figure 10:
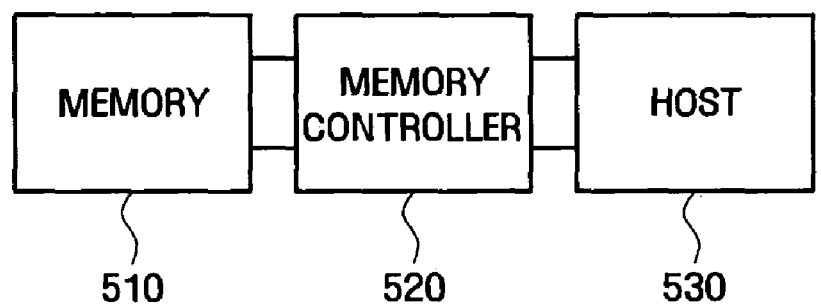
Figure 11:
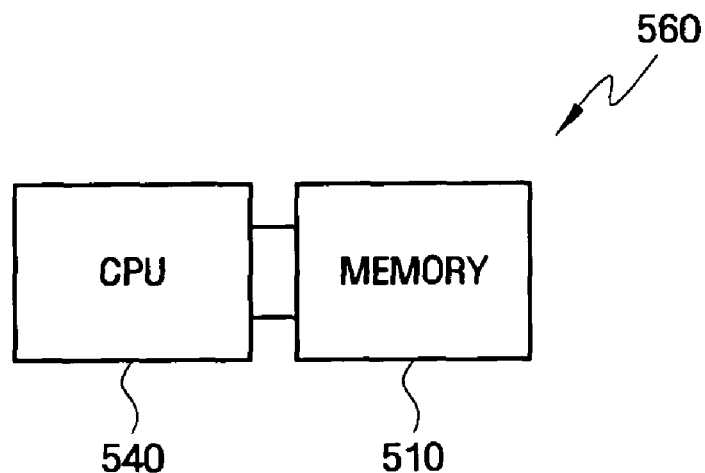

FIGS. 9 through 11 are block diagrams of systems including semiconductor memories according to example embodiments.

Referring to FIG. 9, the system according to example embodiments includes a memory 510 and a memory controller 520 connected to the memory 510. The memory 510 may be a semiconductor memory according to example embodiments described above. The memory controller 520 may transmit input signals for controlling the operation of the memory 510 to the memory 510. The input signals may include a command signal for controlling a read operation and a write operation and an address signal.

The system including the memory 510 and the memory controller 520 can be embedded in a card such as a memory card. Specifically, the system can be embedded in a card that meets a desired industry standard and is used in electronic devices such as a two-way communications system, a one-way pager, a two-way pager, a personal communications system, a portable computer, a personal data assistance (PDA), an audio and/or video player, a digital and/or video camera, a navigation system, a global positioning system (GPS), or the like. However, example embodiments are not limited thereto. The system can also be embodied in various forms such as a memory stick.

Referring to FIG. 10, the system according to example embodiments includes the memory 510, the memory controller 520, and a host system 530. The host system 530 is connected to the memory controller 520 by a bus and provides a control signal to the memory controller 520 such that the memory controller 520 can control the operation of the memory 510. The host system 530 may be a processing system used in a mobile phone, a two-way radio communications system, a one-way pager, a two-way pager, a personal communications system, a portable computer, a PDA, an audio and/or video player, a digital and/or video camera, a navigation system, a GPS, or the like.

In FIG. 10, the memory controller 520 is interposed between the memory 510 and the host system 530. However, example embodiments are not limited thereto. The memory controller 520 may be omitted from a system according to example embodiments.

Referring to FIG. 11, the system according to example embodiments may be a computer system 560 that includes a central processing unit (CPU) 540 and a memory 510. In the computer system 560, the memory 510 may be directly connected to the CPU 540 or may be connected to the CPU 540 using conventional computer bus architecture. The memory 510 may store an operation system (OS) instruction set, a basic input/output start up (BIOS) instruction set, or an advanced configuration and power interface (ACPI) instruction set, or may be used as a large storage device such as a solid-state disk.

For simplicity, not all components of the computer system 560 are illustrated in FIG. 11, but example embodiments are not limited thereto. For simplicity, a memory controller is not interposed between the memory 510 and the CPU 540 in FIG. 11. However, in example embodiments, the memory controller may be interposed between the memory 510 and the CPU 540.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor memory comprising:
a memory cell array including a plurality of memory cells arranged in a plurality of rows and a plurality of columns;
a plurality of bit lines, each bit line connected to a corresponding column of the memory cells;
a column selection circuit configured to select at least one bit line of the plurality of bit lines in response to a column select signal; and
a read circuit configured to precharge the selected at least one bit line in response to a precharge signal, apply a read bias to the precharged at least one bit line in response to a read bias provision signal, and read data from the memory cells connected to the precharged at least one bit line, wherein
a resistance level of each memory cell of the plurality of memory cells varies according to data stored in the memory cell,
the read circuit is configured to read data from a first memory cell of the plurality of memory cells in response to the precharge signal having a first pulse width and read data from a second memory cell of the plurality of memory cells in response to the precharge signal having a second pulse width, and
a resistance of a bit line between the first memory cell and the read circuit is lower than a resistance of a bit line between the second memory cell and the read circuit, and the first pulse width of the precharge signal is smaller than the second pulse width of the precharge signal.

2. The semiconductor memory of claim 1, further comprising:
a plurality of word lines, each word line connected to a corresponding row of the plurality of memory cells; and
a row selection circuit configured to select at least one word line of the plurality of word lines in response to a row select signal,
wherein a resistance of a word line between the first memory cell and the row selection circuit is lower than a resistance of a word line between the second memory cell and the row selection circuit, and the first pulse width of the precharge signal is larger than the second pulse width of the precharge signal.

3. The semiconductor memory of claim 2, wherein each word line of the plurality of word lines includes a first sub-word line and a second sub-word line which are connected to each other by a strapping node, and the first memory cell is located closer to the strapping node than the second memory cell.

4. The semiconductor memory of claim 1, further comprising:
a plurality of word lines, each word lines connected to a corresponding row of the plurality of memory cells; and
a row selection circuit configured to select at least one word line of the plurality of word lines in response to a row select signal,
wherein the row select signal has different pulse widths when the word line connected to the first memory cell is selected and when the word line connected to the second memory cell is selected.

5. The semiconductor memory of claim 1, wherein the read bias provision signal has different pulse widths when data is read from the first memory cell and when data is read from the second memory cell.

6. The semiconductor memory of claim 1, further comprising:
a read pulse generator configured to provide the precharge signal and the read bias provision signal and determine a pulse width of the precharge signal and a pulse width of the read bias provision signal in response to an address signal,
wherein the read circuit includes:
a sensing node connected to the plurality of bit lines,
a precharge unit connected to the sensing node and configured to precharge the plurality of bit lines in response to the precharge signal,
a read bias generation unit connected to the sensing node and configured to provide the read bias in response to the read bias provision signal, and
a sensing unit connected to the sensing node and configured to compare a voltage level of the sensing node with a voltage level of a reference bias, and output a comparison result.

7. The semiconductor memory of claim 1, wherein the memory cell array includes diode-controlled phase-change random access memory (PRAM) cells.

8. The semiconductor memory of claim 1, wherein the read circuit is configured to read data from the first memory cell of the plurality of memory cells in response to the read bias provision signal having a first pulse width and to read data from the second memory cell of the plurality of memory cells in response to the read bias provision signal having a second pulse width.

9. A semiconductor memory comprising:
a memory cell array including a plurality of memory cells arranged in a plurality of rows and a plurality of columns;
a plurality of bit lines, each bit line connected to a corresponding column of the memory cells;

a column selection circuit configured to select at least one bit line of the plurality of bit lines in response to a column select signal; and a read circuit configured to precharge the selected at least one bit line in response to a precharge signal, apply a read bias to the precharged at least one bit line in response to a read bias provision signal, and read data from the memory cells connected to the precharged at least one bit line, wherein a resistance level of each memory cell of the plurality of memory cells varies according to data stored in the memory cell, the read circuit is configured to read data from a first memory cell of the plurality of memory cells in response to the read bias provision signal having a first pulse width and to read data from a second memory cell of the plurality of memory cells in response to the read bias provision signal having a second pulse width, and a resistance of a bit line between the first memory cell and the read circuit is lower than a resistance of a bit line between the second memory cell and the read circuit, and the first pulse width of the precharge signal is smaller than the second pulse width of the precharge signal.

10. A semiconductor memory comprising:

a memory cell array including a plurality of memory cells arranged in a plurality of rows and a plurality of columns;

a plurality of word lines, each word line connected to a corresponding row of the memory cells; and a row selection circuit configured to select at least one word line in response to a row select signal and to pull down voltage level of the selected at least one word line, wherein a resistance level of each memory cell of the plurality of memory cells varies according to data stored in the memory cell, the row selection circuit is configured to select a word line connected to a first memory cell of the plurality of memory cells in response to the row select signal having a first pulse width and to select a word line connected to a second memory cell of the plurality of memory cells in response to the row select signal having a second pulse width, and a resistance of a bit line between the first memory cell and the read circuit is lower than a resistance of a bit line between the second memory cell and the read circuit, and the first pulse width of the precharge signal is smaller than the second pulse width of the precharge signal.

11. The semiconductor memory of claim 10, wherein a resistance of the word line between the first memory cell and the row selection circuit is lower than resistance of the word line between the second memory cell and the row selection circuit.

12. The semiconductor memory of claim 10, wherein the row select signal has different pulse widths when the word lines connected to the first memory cell is selected and when the word line connected to the second memory cell is selected.

13. The semiconductor memory of claim 12, wherein the pulse width of the row select signal is based on a resistance of the word line between the first memory cell and the row selection circuit and the second memory cell and the row selection circuit.

* * * * *